United States Patent
Chen

(10) Patent No.: US 11,894,042 B2
(45) Date of Patent: Feb. 6, 2024

(54) METHOD FOR REFRESHING ROW HAMMER, CIRCUIT FOR REFRESHING ROW HAMMER AND SEMICONDUCTOR MEMORY

(71) Applicant: CHANGXIN MEMORY TECHNOLOGIES, INC., Hefei (CN)

(72) Inventor: Jixing Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 112 days.

(21) Appl. No.: 17/807,478

(22) Filed: Jun. 17, 2022

(65) Prior Publication Data
US 2023/0162777 A1 May 25, 2023

Related U.S. Application Data

(63) Continuation of application No. PCT/CN2022/072108, filed on Jan. 14, 2022.

(30) Foreign Application Priority Data

Nov. 19, 2021 (CN) .......................... 202111399125.2

(51) Int. Cl.
*G11C 11/406* (2006.01)
*G11C 11/408* (2006.01)

(52) U.S. Cl.
CPC .... *G11C 11/40615* (2013.01); *G11C 11/4085* (2013.01); *G11C 11/40622* (2013.01)

(58) Field of Classification Search
CPC .... G11C 11/40; G11C 11/406; G11C 11/4061
USPC ......................................................... 365/222
See application file for complete search history.

(56) References Cited

U.S. PATENT DOCUMENTS

| 9,478,316 | B1 | 10/2016 | Ryu | |
|---|---|---|---|---|
| 9,818,469 | B1 | 11/2017 | Kim | |
| 10,790,005 | B1 | 9/2020 | He | |
| 11,417,385 | B1* | 8/2022 | Ito | G11C 11/40626 |
| 11,626,152 | B2* | 4/2023 | Wu | G11C 11/406 365/222 |

(Continued)

FOREIGN PATENT DOCUMENTS

| CN | 108154895 A | 6/2018 |
|---|---|---|
| CN | 207489475 U | 6/2018 |

(Continued)

OTHER PUBLICATIONS

First Office Action of the Taiwanese application No. 111120193, dated Aug. 17, 2022.

*Primary Examiner* — Muna A Techane
(74) *Attorney, Agent, or Firm* — Syncoda LLC; Feng Ma

(57) ABSTRACT

A method for refreshing row hammer includes the following operations. A row hammer refresh instruction for a target word line is determined. According to the row hammer refresh instruction, a preset row hammer refresh signal is set to a valid state. The valid state of the preset row hammer refresh signal indicates that the row hammer refresh instruction is performed in a first refresh period. In response to detecting that the row hammer refresh instruction is not completed within the first refresh period, the valid state of the preset row hammer refresh signal will be continued to a next refresh period of the first refresh period.

20 Claims, 14 Drawing Sheets

(56) References Cited

U.S. PATENT DOCUMENTS

| | | |
|---|---|---|
| 2018/0025770 A1* | 1/2018 | Ito .................... G11C 29/846 365/222 |
| 2018/0061476 A1 | 3/2018 | Kim |
| 2018/0158507 A1 | 6/2018 | Bang |
| 2019/0228813 A1 | 7/2019 | Nale et al. |
| 2020/0388326 A1 | 12/2020 | He et al. |
| 2021/0151095 A1 | 5/2021 | Nale et al. |
| 2022/0189532 A1 | 6/2022 | Nale et al. |

FOREIGN PATENT DOCUMENTS

| | | |
|---|---|---|
| CN | 111145806 A | 5/2020 |
| CN | 111755047 A | 10/2020 |
| CN | 111863062 A | 10/2020 |

* cited by examiner

METHOD FOR REFRESHING ROW HAMMER, CIRCUIT FOR REFRESHING ROW HAMMER AND SEMICONDUCTOR MEMORY

CROSS-REFERENCE TO RELATED APPLICATION

This application is a continuation of International Application No. PCT/CN2022/072108 filed on Jan. 14, 2022, which claims priority to Chinese Patent Application No. 202111399125.2 filed on Nov. 19, 2021. The disclosures of these applications are hereby incorporated by reference in their entirety.

BACKGROUND

Dynamic Random Access Memory (DRAM) is a semiconductor memory device commonly used in computers, which is composed of many repeated memory cells, and the selection processing needs to be performed on different memory cells via word lines and bit lines. That is to say, there are a large number of word lines in the DRAM, and these word lines are arranged adjacently. When a certain word line is subjected to a row hammer, the word lines adjacent to the word line may generate errors.

SUMMARY

The present disclosure relates to the technical field of integrated circuits, and in particular, to a method for refreshing row hammer, a circuit for refreshing row hammer and a semiconductor memory.

The present disclosure provides a method for refreshing row hammer, a circuit for refreshing row hammer and a semiconductor memory, which can reduce the bandwidth resources occupied by the row hammer refresh processing and improve the refresh correctness.

In a first aspect, the embodiments of the present disclosure provide a method for refreshing row hammer. The method includes the following operations.

A row hammer refresh instruction for a target word line is determined.

According to the row hammer refresh instruction, a preset row hammer refresh signal is set to a valid state. The valid state of the preset row hammer refresh signal indicates that the row hammer refresh instruction is performed in a first refresh period.

In response to detecting that the row hammer refresh instruction is not completed within the first refresh period, the valid state of the preset row hammer refresh signal will be continued to a next refresh period of the first refresh period.

In a second aspect, the embodiments of the present disclosure provide a circuit for refreshing a row hammer. The circuit includes a detection circuit.

The detection circuit is configured to determine a row hammer refresh trigger signal and a refresh execution signal; and output a preset row hammer refresh signal in a valid state in response to the row hammer refresh trigger signal indicating that a row hammer refresh instruction for a target word line is received and the refresh execution signal indicating that the row hammer refresh instruction is not completed.

The valid state of the preset row hammer refresh signal indicates that the row hammer refresh instruction is performed within a first refresh period, and the valid state of the preset row hammer refresh signal will be continued to a next refresh period of the first refresh period in a case that the row hammer refresh instruction is not completed within the first refresh period.

In a third aspect, embodiments of the present disclosure provide a semiconductor memory, including the circuit for refreshing row hammer described in the second aspect.

DETAILED DESCRIPTION

Figure 1A:
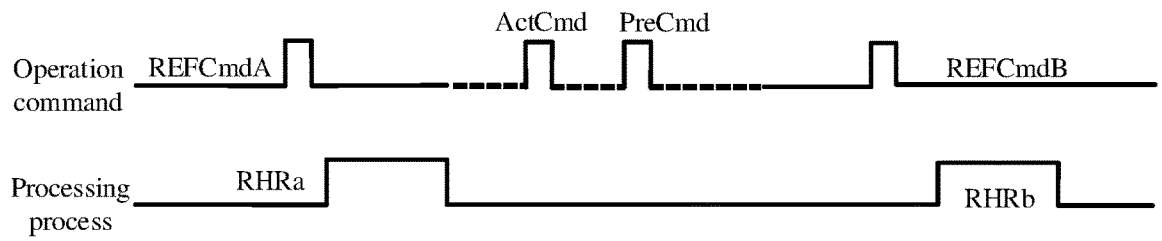
FIG. 1A is a schematic diagram of a process of refreshing row hammer provided by some implementations.

The technical solutions in the embodiments of the present disclosure will be clearly and completely described below with reference to the accompanying drawings in the embodiments of the present disclosure. It should be understood that the specific embodiments described herein are only used to explain the related application, but not to limit the present disclosure. In addition, it should be noted that, for the convenience of description, only the parts related to the relevant application are shown in the drawings.

Unless otherwise defined, all technology and scientific terms used herein have the same meaning as commonly understood by one of ordinary skill in the art to which the present disclosure belongs. The terms used herein are for the purpose of describing the embodiments of the present disclosure only and is not intended to limit the present disclosure.

In the following description, reference is made to "some embodiments" which describe a subset of all possible embodiments, but it should be understood that "some embodiments" may be the same or a different subset of all possible embodiments, and may be combined with each other without conflict.

The "first\second\third" involved in the embodiments of the present disclosure is only used to distinguish similar objects, and does not represent a specific ordering of objects. It should be understood that "first\second\third" may be interchanged in a specific order or precedence if allowed, so that the embodiments of the present disclosure described herein can be implemented in an order other than those illustrated or described herein.

The English words and their abbreviations involved in the embodiments of the present disclosure are described below.
Row Hammer: hammer, or called row hammer
DRAM: Dynamic Random Access Memory
SDRAM: Synchronous Dynamic Random Access Memory
Memory Array: storage array
WL: Word Line
BL: Bit Line
RHR: Preset row hammer refresh signal
RHRact1: First target state signal
RHRact2: Second target state signal
RHRStart: Row hammer refresh trigger signal
Refreshpulse1: Initial refresh execution signal
RefPulseCounter: Refresh pulse signal
RHRCk: First clock signal
RHRCkN: First inverted clock signal
RHRState1: First refresh state signal
RHRState2: Second refresh state signal
Rfsh: Refresh state valid signal
RasEnpulse: Word line start pulse signal
RHRCounter: Second clock signal
RHRCounterN: Second inverted clock signal
ResetN: Reset signal It should be understood that a DRAM is a semiconductor memory device commonly used in computers, and many repeated memory cells form a Memory Array, and the selection processing needs to be performed on different memory cells via word lines and bit lines.

In some implementations, after a row hammer is detected, a refresh processing is performed on the affected word lines. However, the refresh processing needs to be completed by means of two refresh instructions, which occupies bandwidth resources and easily leads to refresh errors.

The embodiments of the present disclosure provide a method for refreshing row hammer, a circuit for refreshing row hammer and a semiconductor memory. The method includes the following operations. A row hammer refresh instruction for a target word line is determined. According to the row hammer refresh instruction, a preset row hammer refresh signal is set to a valid state. The valid state of the preset row hammer refresh signal indicates that the row hammer refresh instruction is performed in a first refresh period. In response to detecting that the row hammer refresh instruction is not completed within the first refresh period, the valid state of the preset row hammer refresh signal will be continued to a next refresh period of the first refresh period. In this way, under normal cases, the valid state of the preset row hammer refresh signal lasts for one refresh period, so that the row hammer refresh instruction is completed through one refresh period. In the case that an occasional error occurs, the valid state of the preset row hammer refresh signal will be continued to the next refresh period, so that the row hammer refresh instruction is completed through two refresh periods, which can not only save bandwidth resources, but also improve the correctness of row hammer refresh.

At present, as memory cells become denser, the distance between word lines becomes smaller and smaller, resulting in increased capacitive coupling between adjacent word lines. If the word line (also known as the target row) is repeatedly activated, it may cause two adjacent word lines (also known as the victim rows) to be subjected to electromagnetic interference, so that the memory cells on the victim rows will occur the phenomenon of losing charge, and eventually these memory cell may lose data before the next refresh of the victim row. The above case is called row hammer.

That is to say, when a word line is subjected to row hammer, the two word lines adjacent to this word line will be greatly interfered. Therefore, in order to eliminate the impact of the row hammer, when it is detected that the target row is subjected to row hammer, the victim rows on both sides of the target row need to be refreshed, which is called Row hammer Refresh.

Figure 1B:
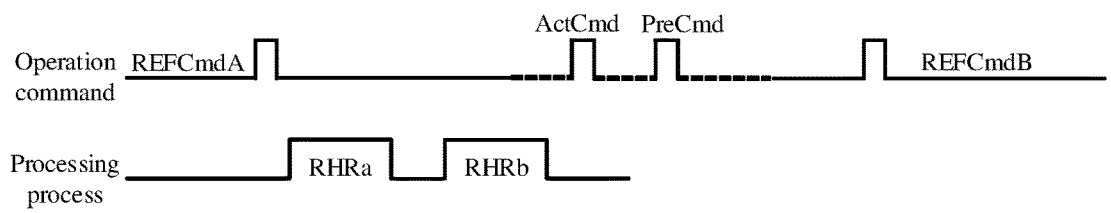
FIG. 1B is a schematic diagram of another process of refreshing row hammer provided by some implementations.

For convenience of description, the addresses of the two WLs (i.e., the victim rows) are correspondingly called Ra and Rb, and the refresh operations on these two addresses are called RHRa and RHRb. Referring to FIG. 1A, a schematic diagram of a process of refreshing row hammer provided by some implementations is shown. Referring to FIG. 1B, a schematic diagram of another process of refreshing row hammer provided by some implementations is shown. In FIG. 1A and FIG. 1B, ActCmd refers to the word line activation command, PreCmd refers to the word line precharge command (Pre), REFCmdA refers to the first refresh command, and REFCmdB refers to the second refresh command. In addition, the time required to complete a refresh command is also referred to as one refresh period.

In a related art, as shown in FIG. 1A, the refresh of adjacent word lines needs to involve two refresh commands, which not only occupies bandwidth resources, but also easily leads to some errors. In another related art, as shown in FIG. 1B, the refresh of adjacent word lines is completed in one refresh command, but this method may also cause RHR errors in some occasional cases.

Figure 2:
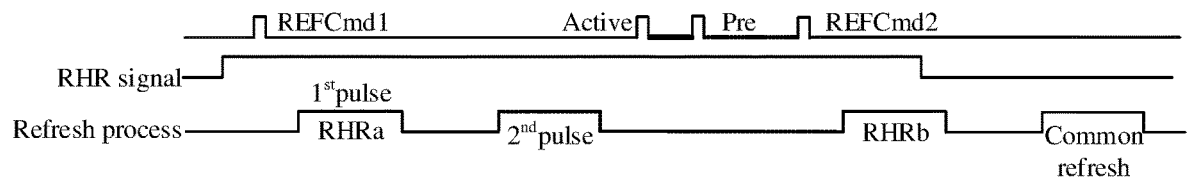
FIG. 2 is a schematic diagram of another process of refreshing row hammer provided by some implementations.

Taking one refresh command to complete the process of refreshing row hammer as an example, the possible occasional error is described. Referring to FIG. 2, a schematic diagram of another process of method for refreshing row hammer provided by some implementations is shown. As shown in FIG. 2, after receiving the row hammer refresh instruction, the RHR signal is in a valid state to indicate that the Memory Array performs the row hammer refresh in the refresh command (REFCmd1, etc.). Here, the refresh command corresponds to two pulses, i.e., $1^{st}$ Pulse and $2^{nd}$ Pulse, so that RHRa and RHRb are respectively performed via these two pulses, thereby completing the row hammer refresh in one refresh command. However, if some inappropriate operations cause missing for the second pulse ($2^{nd}$ Pulse) of the refresh command REFCmd1, the situation of RHRa and RHRb being respectively performed in two Refresh commands will be occurred, resulting in word line activation (Active), word line pre-charge (Precharge) and other operations may be occurred between RHRa and RHRb. That is, word line activation, word line pre-charge, or other operations is occurred when the row hammer refresh has not been completed. This case needs to be avoided.

Based on this, the embodiments of the present disclosure provide a method for refreshing row hammer. The method includes the following operations. A row hammer refresh instruction for a target word line is determined. According to the row hammer refresh instruction, a preset row hammer refresh signal is set to a valid state. The valid state of the preset row hammer refresh signal indicates that the row hammer refresh instruction is performed in a first refresh period. In response to detecting that the row hammer refresh instruction is not completed within the first refresh period, the valid state of the preset row hammer refresh signal will be continued to a next refresh period of the first refresh period. In this way, under normal cases, the valid state of the preset row hammer refresh signal lasts for one refresh period, so that the row hammer refresh instruction is completed through one refresh period. In the case that an occasional error occurs, the valid state of the preset row hammer refresh signal will be continued to the next refresh period, so that the row hammer refresh instruction is completed through two refresh periods, which can not only save bandwidth resources, but also improve the correctness of row hammer refresh.

The embodiments of the present disclosure will be described in detail below with reference to the accompanying drawings.

Figure 3:
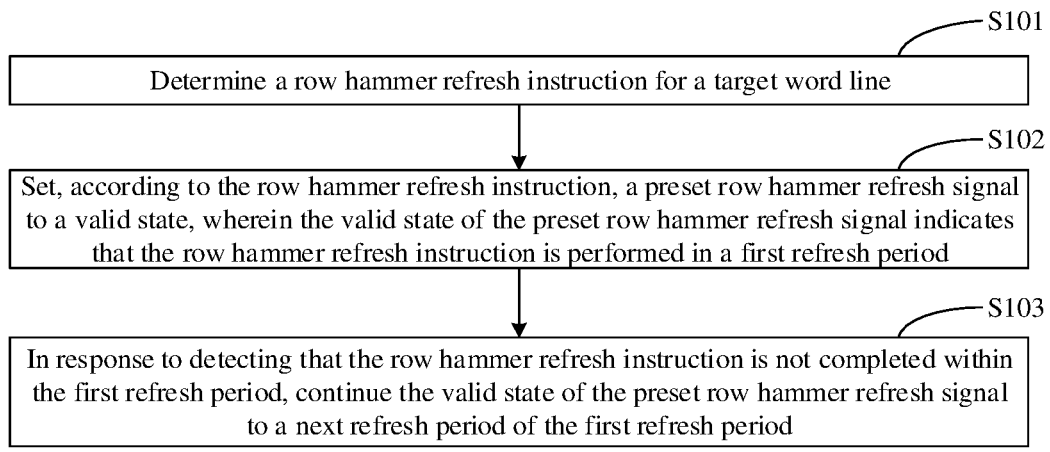
FIG. 3 is a schematic flowchart of a method for refreshing row hammer provided by the embodiments of the present disclosure.

In an embodiment of the present disclosure, referring to FIG. 3, a schematic flowchart of a method for refreshing row hammer provided by the embodiment of the present disclosure is shown. As shown in FIG. 3, the method may include the following steps.

In step S101, a row hammer refresh instruction for a target word line is determined.

It should be noted that the method for refreshing row hammer provided by the embodiments of the present disclosure is applicable for a semiconductor memory device, such as DRAM, SDRAM, etc., which can better perform refreshing on the word lines subjected to row hammer.

Here, the target word line refers to the target row subjected to the row hammer, the first adjacent word line and the second adjacent word line refer to the victim rows in the row hammer.

For semiconductor memory devices, after detecting the row hammer for the target word line, a row hammer refresh instruction for the target word line is generated to instruct to refresh the first adjacent word line and the second adjacent word line, so as to avoid the problem that data loss for the first adjacent word line and the second adjacent word line occurs.

Here, for the manner for determining the row hammer, related technologies may be referred, so the details are not described in the embodiment of the present disclosure.

In step S102, according to the row hammer refresh instruction, a preset row hammer refresh signal is set to a valid state. The valid state of the preset row hammer refresh signal indicates that the row hammer refresh instruction is performed in a first refresh period.

It should be noted that, in the semiconductor memory device, a preset row hammer refresh signal, specially used to instruct the Memory Array to perform the row hammer refresh operation, is set. In other words, if the preset row hammer refresh signal is valid, the Memory Array needs to perform row hammer refresh for the specified word lines, and if the preset row hammer refresh signal is invalid, the Memory Array does not need to perform row hammer refresh.

According to the row hammer refresh instruction, the preset row hammer refresh signal is set to the valid state, so as to perform the refresh instruction in the first refresh period. Here, the refresh period may be understood as a time period for performing a refresh operation, and specifically refers to the time after the refresh command is received and before the next operation instruction is received, that is, one refresh period corresponds to one refresh command. The first refresh period may refer to the latest refresh period after the preset row hammer refresh signal is in the valid state.

In step S103, in response to detecting that the row hammer refresh instruction is not completed within the first refresh period, the valid state of the preset row hammer refresh signal will be continued to the next refresh period of the first refresh period.

It should be noted that, under normal cases, the first adjacent word line and the second adjacent word line can be refreshed within the first refresh period to complete the row hammer refresh instruction. However, if an occasional error occurs, the row hammer refresh instruction may not be completed within the first refresh period, and the valid state of the preset row hammer refresh signal needs to be continued to the next refresh period of the first refresh period, so as to complete the row hammer refresh instruction within two refresh periods.

It should be understood that, in a semiconductor memory device, not only refresh periods but also other operation periods exist, so the first refresh period and the next refresh period are not consecutive in time.

In some embodiments, in response to detecting that the row hammer refresh instruction is completed, the preset row hammer refresh signal is set to an invalid state.

It should be noted that, if the row hammer refresh instruction is completed within the first refresh period, then the preset row hammer refresh signal is set to the invalid state after the end of the first refresh period. In this way, the row hammer refresh process is completed through one refresh command. On the contrary, if the row hammer refresh instruction is not completed within the first refresh period, the valid state of the preset row hammer refresh signal will be continued to the next refresh period of the first refresh period, so that the row hammer refresh process will be continued to be performed in the next refresh period. In this way, the row hammer refresh process is completed through two refresh commands.

That is to say, in a related art, the valid state of the preset row hammer refresh signal lasts for two refresh periods fixedly, so that one row hammer refresh instruction is completed in two refresh commands. However, in this way, a larger bandwidth is occupied, and resources are wasted. In another related art, the preset valid state of the row hammer refresh signal lasts for one refresh period fixedly, so that one row hammer refresh instruction is completed in one refresh command, but the refresh may fail due to an occasional error.

In the embodiments of the present disclosure, a method for refreshing row hammer capable of automatic error correction is provided. Under normal cases, the valid state of the preset row hammer refresh signal lasts for one refresh period, so that the row hammer refresh instruction is completed within one refresh period. In the case that an occasional error occurs, the valid state of the preset row hammer refresh signal will be continued to the next refresh period, so that the row hammer refresh instruction is completed through two refresh periods, which can not only save bandwidth resources, but also improve the correctness of row hammer refresh.

It should also be noted that the row hammer refresh instruction instructs to refresh the first adjacent word line of the target word line and the second adjacent word line of the target word line.

Correspondingly, in some embodiments, the method may further include the following operations.

Whether the first adjacent word line and the second adjacent word line are both refreshed is determined in the first refresh period.

If the first adjacent word line is refreshed and the second adjacent word line is not refreshed, it is determined that the row hammer refresh instruction is not completed within the first refresh period.

Alternatively, if the first adjacent word line and the second adjacent word line are both refreshed, it is determined that the row hammer refresh instruction is completed within the first refresh period.

That is to say, the row hammer refresh instruction includes refreshing the first adjacent word line and the second adjacent word line on two sides of the target word line respectively. Therefore, according to the refresh states of the first adjacent word line and the second adjacent word line, it is determined whether the row hammer refresh instruction is completed in the first refresh period.

In some embodiments, a first target state signal and a second target state signal are set and applied to record the states of the first adjacent word line and the second adjacent word line, respectively. The method may also include the following operations.

The first target state signal and the second target state signal are determined. The first target state signal is configured to record the refresh state of the first adjacent word line, and the second target state signal is configured to record the refresh state of the second adjacent word line.

When refreshing is conducted for the first adjacent word line, the first target state signal is set to the valid state, and the second target state signal is set to the invalid state.

When refreshing is conducted for the second adjacent word line, the first target state signal is set to the invalid state, and the second target state signal is set to the valid state.

It should be noted that the initial states of the first target state signal and the second target state signal are both invalid. After receiving the row hammer refresh instruction, the refreshing is performed for the first adjacent word line. At this time, the first target state signal jumps to be valid, and the second target state signal is still invalid. Finally, the refreshing is performed for the second adjacent word line. The first target state signal jumps again to be invalid, the second target state signal jumps to be valid, and the row hammer refresh instruction is completed.

In addition, after the row hammer refresh instruction is completed, the first target state signal and the second target state signal will be reset to the invalid state again. The specific reset process may be implemented by using circuits with various principles, which will not be described in the embodiments of the present disclosure.

In addition to the above, the word line activation operation may be interposed between the refresh operation of the first adjacent word line and the refresh operation of the second adjacent word line. That is to say, only the refresh of the first adjacent word line is completed within the first refresh period, and the word line activation instruction is received after the end of the first refresh period, thus entering the activation operation period, and then entering the next refresh period again. The operation on the second adjacent word line is completed in the next refresh period. This case easily leads to processing errors, and the embodiments of the present disclosure record this case separately for subsequent processing. Exemplarily, in this case, the first target state signal and the second target state signal are both set to be invalid collectively.

Therefore, in some embodiments, in a case of detecting that the row hammer refresh instruction is not completed within the first refresh period, the method may further include the following operations.

Whether the word line activation instruction is received is determined.

If a determination result is yes, the first target state signal and the second target state signal are both set to be the invalid state.

In this way, at the beginning of a certain refresh period, if the first target state signal and the second target state signal are invalid, there are two possibilities: the previous row hammer refresh instruction was completed normally, and the previous row hammer refresh instruction was not completed and a word line activation instruction was received. It should be understood that the same process may be performed subsequently for the above two possibilities, so no further subdivision is performed. At the beginning of a certain refresh period, if the first target state signal is valid and the second target state signal is invalid, the last row hammer refresh instruction is not completed and no word line activation instruction is received.

In this way, whether the word line activation instruction is inserted in the middle when an occasional error occurs may be distinguished through the first target state signal and the second target state signal, so as to perform targeted processing subsequently.

It should also be noted that the word line activation instruction may be an activation instruction for any word line in the Memory Array, and is not limited to the target word line, the first adjacent word line and the second adjacent word line.

In some embodiments, the method may also include the following operations.

In a case that the preset row hammer refresh signal is in the valid state, the first target state signal and the second target state signal are determined.

Word line refresh processing is performed on adjacent word lines of the target word line according to the first target state signal and the second target state signal.

It should be noted that, when the preset row hammer refresh signal is valid, the specific steps for performing the refresh processing need to be determined according to the first target state signal and the second target state signal.

Specifically, the operation of performing the word line refresh processing on adjacent word lines of the target word line according to the first target state signal and the second target state signal may include the following operations.

In a case that the first target state signal and the second target state signal are both in the invalid state, the word line refresh processing is performed on the first adjacent word line and the second adjacent word line respectively.

In a case that the first target state signal is in the valid state and the second target state signal is in the invalid state, the word line refresh processing is performed twice on the second adjacent word line.

It should be noted that in the case that an occasional error occurs, at the beginning of the next refresh period, if the first target state signal and the second target state signal are both invalid, the refreshing is performed on the first adjacent word line and the second adjacent word line respectively to avoid inserting the word line activation operation during the refresh processes of the first adjacent word line and the second adjacent word line. If the first target state signal is valid and the second target state signal is invalid, the refresh processing is performed twice on the second adjacent word line.

In other words, for a certain refresh period, there are at least the following two cases.

In the first case, at the beginning of a certain refresh period, the preset row hammer refresh signal is in the valid state, and the first target state signal and the second target state signal are both invalid. There are two possibilities for this case: (1) The row hammer refresh instruction is received in the present refresh period. (2) The row hammer refresh instruction was received in the previous refresh period, but the row hammer refresh instruction was not completed in the previous refresh period due to the occasional error, and word line activation instruction is occurred between the previous refresh period and the present refresh period. For the above two possibilities, it is necessary to perform refreshing on the first adjacent word line and the second adjacent word line in the present refresh period.

In the second case, at the beginning of a certain refresh period, the preset row hammer refresh signal is in the valid state, the first target state signal is valid, and the second target state signal is invalid, which indicates that the row hammer refresh instruction is received in the previous refresh period of the present refresh period. However, due to an occasional error, the refreshing was only performed on the first adjacent word line in the previous refresh period, and word line activation instruction was not received between the previous refresh period and the present refresh period. At this time, the word line refresh processing may be directly performed on the second adjacent word line repeatedly, so that the row hammer refresh instruction that was not completed in the previous refresh period is completed.

Here, for the second case, the reasons for not choosing to perform refreshing on the two word lines once respectively include: only one word line needs to be started when refreshing is performed on a certain word line twice. The process is simple, the power consumption is low, and the complexity of circuit design is reduced. For this section, please refer to the subsequent description of the row hammer refresh circuit.

Of course, in some other embodiments, a manner of performing refreshing on the first adjacent word line and the second adjacent word line respectively may also be adopted in the second case.

In addition, in the embodiments of the present disclosure, the definitions of the valid state and the invalid state may be selected according to actual application scenarios. For example, the valid state of a certain signal may mean that the signal is at a high level state, the invalid state of a certain signal may mean that the signal is at a low level state, or the valid state of a certain signal may mean that the signal is at a low level state, the invalid state of a certain signal can mean that the signal is in a high level state.

In view of above, the embodiments of the present disclosure provide a method for refreshing row hammer, which has the function of automatic error correction. The method for refreshing row hammer is accomplished by means of a preset row hammer refresh signal, a first target state signal and a second target state signal. In this way, on the one hand, under normal cases, the valid state of the preset row hammer refresh signal lasts for one refresh period, and the row hammer refresh instruction ican be completed within one refresh period. In the case that the occasional error occurs, the valid state of the preset row hammer refresh signal will be continued to the next refresh period, so that the row hammer refresh instruction is completed through two refresh periods, which not only saves bandwidth resources, but also ensures the smooth completion of the row hammer refresh. On the other hand, the first target state signal and the two target state signals are used to record the refresh states of the first adjacent word line and the second adjacent word line, and determine whether the word line activation instruction is received after the first adjacent word line is refreshed and before the second adjacent word line is refreshed, so as to perform targeted processing subsequently, avoid inserting the word line activation instruction between the refreshing of the first adjacent word line and the refreshing of the second adjacent word line, and improve the correctness of the row hammer refresh.

The embodiments of the present disclosure provide a method for refreshing row hammer. A row hammer refresh instruction for a target word line is determined. According to the row hammer refresh instruction, a preset row hammer refresh signal is set to a valid state. The valid state of the preset row hammer refresh signal indicates that the row hammer refresh instruction is performed in a first refresh period. In response to detecting that the row hammer refresh instruction is not completed within the first refresh period, the valid state of the preset row hammer refresh signal will be continued to a next refresh period of the first refresh period. In this way, under normal cases, the valid state of the preset row hammer refresh signal lasts for one refresh period, so that the row hammer refresh instruction is completed through one refresh period. In the case that an occasional error occurs, the valid state of the preset row hammer refresh signal will be continued to the next refresh period, so that the row hammer refresh instruction is completed through two refresh periods, which can not only save bandwidth resources, but also improve the correctness of row hammer refresh.

Figure 4:
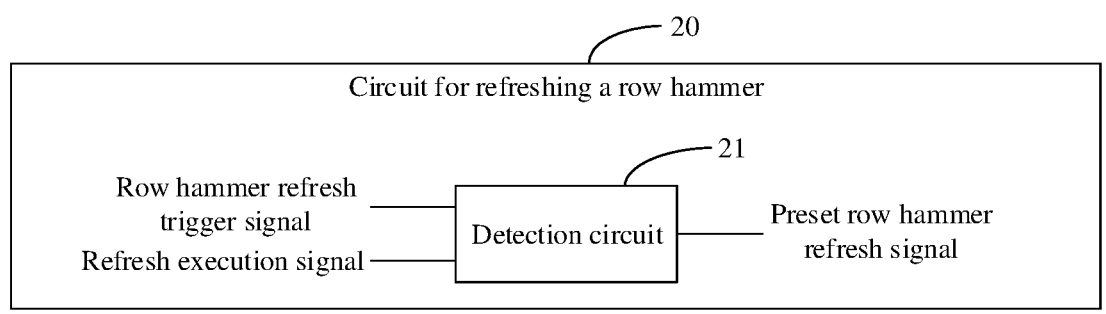
FIG. 4 is a schematic structural diagram of a circuit for refreshing row hammer provided by the embodiments of the present disclosure.

In another embodiment of the present disclosure, referring to FIG. 4, it shows a schematic structural diagram of a circuit for refreshing row hammer 20 provided by the embodiments of the present disclosure. As shown in FIG. 4, the circuit for refreshing row hammer 20 includes a detection circuit 21.

The detection circuit 21 is configured to determine a row hammer refresh trigger signal RHRStart and a refresh execution signal, and output a preset row hammer refresh signal RHR in a valid state in response to the row hammer refresh trigger signal RHRStart indicating that a row hammer refresh instruction for a target word line is received and the refresh execution signal indicating that the row hammer refresh instruction is not completed.

It should be noted that the circuit for refreshing row hammer 20 provided by the embodiments of the present disclosure is applicable for a semiconductor memory device, such as DRAM, SDRAM, etc., which can better perform refreshing on the word lines subjected to row hammer.

In the embodiments of the present disclosure, the circuit for refreshing row hammer 20 includes a detection circuit 21. The input end of the detection circuit 21 is the row hammer refresh trigger signal RHRStart and the refresh execution signal, and the output end of the detection circuit 21 is the preset row hammer refresh signal RHR. The different states of the row hammer refresh trigger signal RHRStart can indicate whether the row hammer refresh instruction for the target word line is received, and the different states of the refresh execution signal can indicate whether the row hammer refresh instruction is completed.

Here, the valid state of the preset row hammer refresh signal RHR indicates that the row hammer refresh instruction is performed within the first refresh period, and the valid state of the preset row hammer refresh signal RHR will be continued to a next refresh period of the first refresh period in a case that the row hammer refresh instruction is not completed within the first refresh period.

That is to say, in a case that the row hammer refresh instruction for the target word line is received and the row hammer refresh instruction is not completed, the detection circuit 21 will be continued to output the preset row hammer refresh signal RHR in the valid state to instruct the memory array to perform the relevant row hammer refresh processing. In addition, in a case that the row hammer refresh instruction for the target word line is not received, or the row hammer refresh instruction has been completed, the detection circuit 21 will output a preset row hammer refresh signal RHR in the invalid state. In this way, under normal cases, the valid state of the preset row hammer refresh signal lasts for one refresh period, so that the row hammer refresh instruction is completed through one refresh period. In the case that an occasional error occurs, the valid state of the preset row hammer refresh signal will be continued to the next refresh period, so that the row hammer refresh instruction is completed through two refresh periods, which can not only save bandwidth resources, but also improve the correctness of row hammer refresh.

Here, the row hammer refresh instruction instructs to perform word line refresh processing on the first adjacent word line of the target word line and the second adjacent word line of the target word line. That is, one row hammer refresh instruction includes two word line refresh processes.

In some embodiments, the refresh execution signal includes an initial refresh execution signal Refreshpulse1 and a refresh pulse signal RefPulseCounter. The initial refresh execution signal Refreshpulse1 is configured to indicate the word line refresh processing that occurs for the first time in each refresh period, and the refresh pulse signal RefPulseCounter is configured to indicate the word line refresh processing that occurs each time in the each refresh period.

Figure 5:
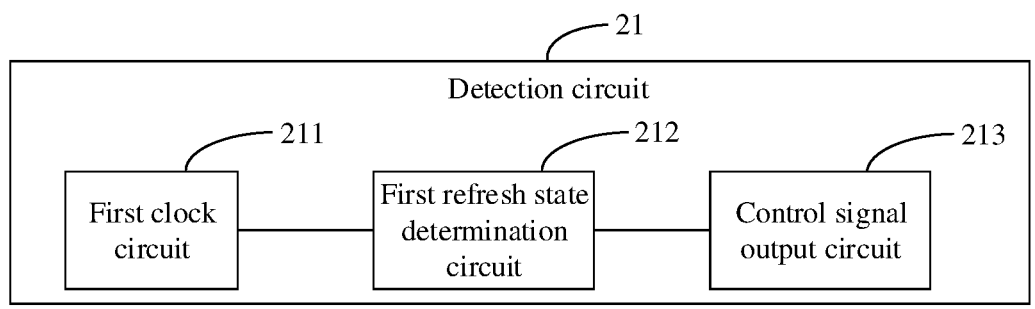
FIG. 5 is a schematic structural diagram of a detection circuit provided by the embodiments of the present disclosure.

Correspondingly, referring to FIG. 5, it shows a schematic structural diagram of a detection circuit 21 provided by the embodiments of the present disclosure. As shown in FIG. 5, the detection circuit 21 includes a first clock circuit 211, a first refresh state determination circuit 212 and a control signal output circuit 213.

The first refresh state determination circuit 212 is configured to determine the first refresh state signal RHRState1 and the second refresh state signal RHRState2 according to the row hammer refresh trigger signal RHRStart, the first clock signal RHRCk and the first inverted clock signal RHRCkN.

The first clock circuit 211 is configured to determine the first clock signal RHRCk and the first inverted clock signal RHRCkN according to the first refresh state signal RHRState1, the initial refresh execution signal Refreshpulse1 and the refresh pulse signal RefPulseCounter.

The control signal output circuit 213 is configured to determine the preset row hammer refresh signal RHR according to the row hammer refresh trigger signal RHRStart and the second refresh state signal RHRState2.

It should be noted that the detection circuit 21 at least includes the following three parts: the first clock circuit 211, the first refresh state determination circuit 212 and the control signal output circuit 213.

(1) The first clock circuit 211 is mainly configured to output the first clock signal RHRCk and the first inverted clock signal RHRCkN, so as to provide necessary signal support for the subsequent first refresh state determination circuit 212.

Figure 6:
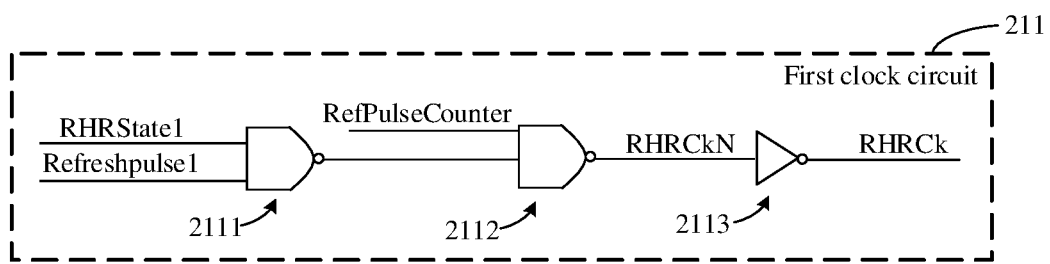
FIG. 6 is a schematic diagram of a specific circuit structure of a first clock circuit provided by the embodiments of the present disclosure.

Exemplarily, referring to FIG. 6, it shows a schematic diagram of a specific circuit structure of the first clock circuit 211 provided by the embodiments of the present disclosure. As shown in FIG. 6, the first clock circuit includes a first two-input NAND gate 2111, a second two-input NAND gate 2112 and a first NOT gate 2113.

The input ends of the first two-input NAND gate 2111 are respectively connected with the first refresh state signal RHRState1 and the initial refresh execution signal Refreshpulse1. The input ends of the second two-input NAND gate 2112 are respectively connected with the output end of the first two-input NAND gate 2111 and the refresh pulse signal RefPulseCounter. The output end of the second two-input NAND gate 2112 is configured to output the first inverted clock signal RHRCkN. The input end of the first NOT gate 2113 is connected with the first inverted clock signal RHRCkN, the output end of the first NOT gate 2113 is configured to output the first clock signal RHRCk.

(2) The first refresh state determination circuit 212 is mainly configured to output the first refresh state signal RHRState1 and the second refresh state signal RHRState2, so as to record the refresh state of the first adjacent word line and the refresh state of the second adjacent word line, so as to provide necessary signal support for the subsequent control signal output circuit 213.

Figure 7:
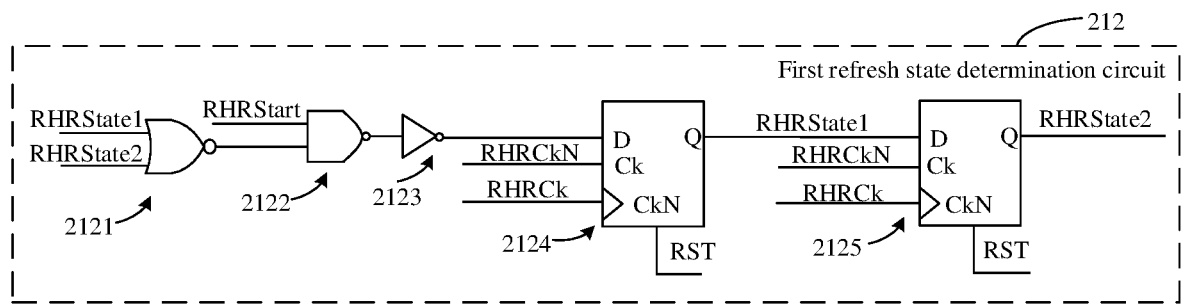
FIG. 7 is a schematic diagram of a specific circuit structure of a first refresh state determination circuit provided by the embodiments of the present disclosure.

Exemplarily, referring to FIG. 7, it shows a schematic diagram of a specific circuit structure of a first refresh state determination circuit 212 provided by the embodiments of the present disclosure. As shown in FIG. 7, the first refresh state determination circuit 212 includes a first two-input NOR gate 2121, a third two-input NAND gate 2122, a second NOT gate 2123, a first trigger 2124 and a second trigger 2125.

The input ends of the first two-input NOR gate 2121 are respectively connected with the first refresh state signal RHRState1 and the second refresh state signal RHRState2, and the input ends of the third two-input NAND gate 2122 are respectively connected with the output end of the first two-input NOR gate 2121 and the row hammer refresh trigger signal RHRStart. The input end of the second NOT gate 2123 is connected with the output end of the third two-input NAND gate 2122. The input end of the first trigger 2124 is connected with the output end of the second NOT gate 2123. The clock end of the first trigger 2124 is respectively connected with the first clock signal RHRCk and the first inverted clock signal RHRCkN, and the output end of the first trigger 2124 is configured to output the first refresh state signal RHRState1. The input end of the second trigger 2125 is connected with the first refresh state signal RHRState1, the clock end of the second trigger 2125 is respectively connected with the first clock signal RHRCk and the first inverted clock signal RHRCkN, and the output end of the second trigger 2125 is configured to output the second refresh state signal RHRState2.

In addition, the reset end of the first trigger 2124 and the reset end of the second trigger 2125 are both connected with a signal RST, which is used for resetting the first refresh state signal and the second refresh state signal.

(3) The control signal output circuit 213 is mainly used for the preset row hammer refresh signal RHR.

Figure 8:
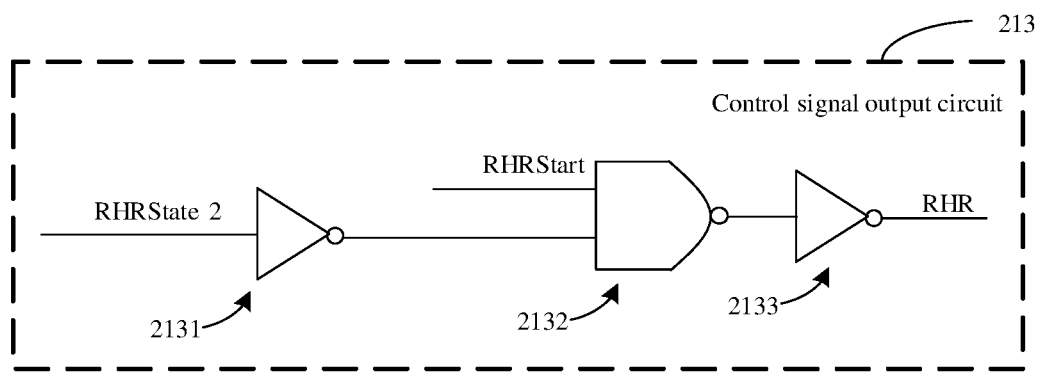
FIG. 8 is a schematic diagram of a specific circuit structure of a control signal output circuit provided by the embodiments of the present disclosure.

Exemplarily, referring to FIG. 8, it shows a schematic diagram of a specific circuit structure of the control signal output circuit 213 provided by the embodiments of the present disclosure. As shown in FIG. 8, the control signal output circuit 213 includes a third NOT gate 2131, a fourth two-input NAND gate 2132 and a fourth NOT gate 2133.

The input end of the third NOT gate 2131 is connected with the second refresh state signal RHRState2, and the input ends of the fourth two-input NAND gate 2132 are respectively connected with the output end of the third NOT gate 2131 and the row hammer refresh trigger signal RHRStart. The input end of the fourth NOT gate 2133 is connected with the output end of the fourth two-input NAND gate 2132, and the output end of the fourth NOT gate 2133 is configured to output the preset row hammer refresh signal RHR.

From the above, by means of the first refresh state determination circuit 212, the first clock circuit 211 and the control signal output circuit 213, the first refresh state signal RHRState1 and the second refresh state signal RHRState2 are determined according to the refresh execution signal Refreshpulse1, the refresh pulse signal RefPulseCounter and the row hammer refresh trigger signal RHRStart. Finally, the preset row hammer refresh signal RHR is output.

In a specific embodiment, for the above circuit, the initial refresh execution signal Refreshpulse1 is in the valid state at the first pulse (the pulse is used to start the word line) in the refresh period, and is in the invalid state at other times. The refresh pulse signal RefPulseCounter will generate a square wave at each pulse in the refresh period. RHRStart will generate a rising edge after receiving the row hammer refresh instruction, and generate a falling edge after the end of the row hammer refresh instruction. The change mode of other signals may be inferred from specific circuit elements.

Exemplarily, a specific scenario is provided below to illustrate the signal processing logic of the first clock circuit 211, the first refresh state determination circuit 212 and the control signal output circuit 213.

Scenario description: for the row hammer refresh instruction, it is executed normally in the first pulse (1st pulse) in the first refresh period (that is, the refresh period corresponding to REFCmd1), but the second pulse (2nd pulse) is missing due to occasional errors, causing that only RHRa is executed in the first refresh period, and RHRa and RHRb need to be executed once again in the next refresh period.

Figure 9:
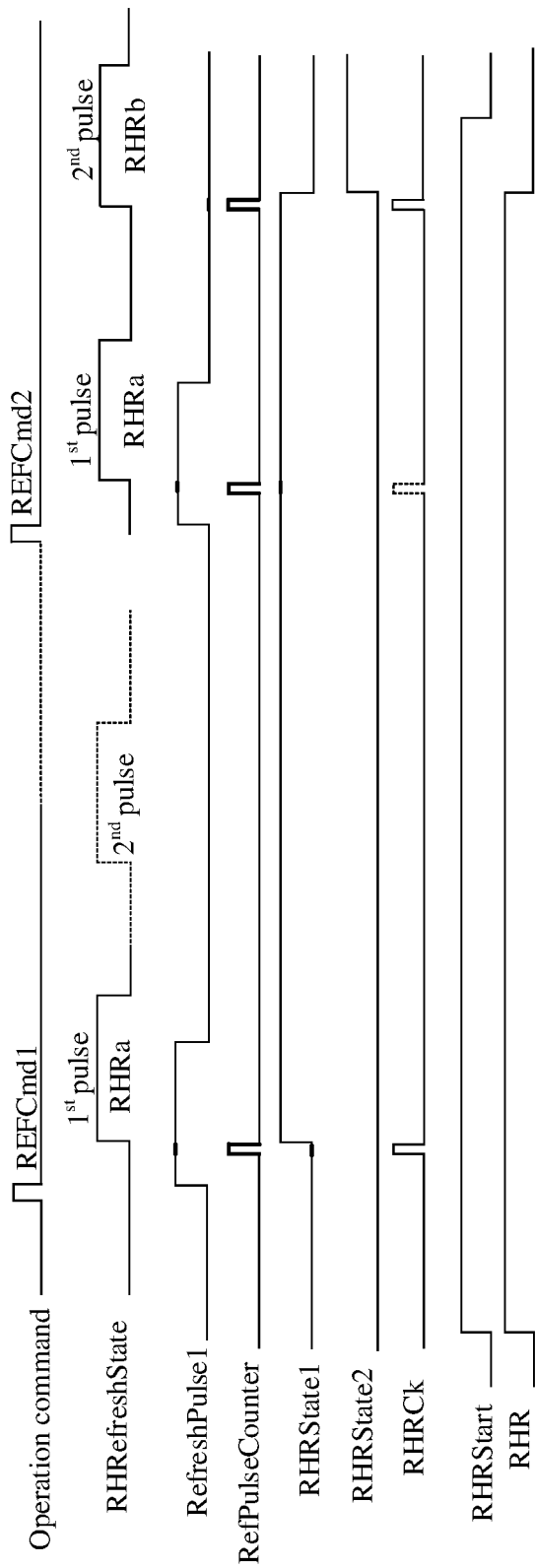
FIG. 9 is a schematic diagram of a signal timing sequence of a detection circuit provided by the embodiments of the present disclosure.

Signal processing logic: referring to FIG. 9, it shows a schematic diagram of a signal timing sequence of a detection circuit 21 provided by the embodiments of the present disclosure.

As shown in FIG. 9, firstly, after receiving the row hammer refresh instruction, RHRStart changes to a high level (that is, the valid state), and RHR changes to a high level accordingly, so as to indicate that refreshing is performed on the first adjacent word line and the second adjacent word line.

Next, at the 1st Pulse in the first refresh period, word line refresh processing is performed on the first adjacent word line, i.e., RHRa. In addition, during 1st Pulse, Refreshpulse1 is at high level, and RefPulseCounter generates a square wave after the address of each Pulse is latched, causing the states of RHRCkN (not shown in the figure) and RHRCk output by the first clock circuit are changed, and the state of RHRState1 changes after RHRCkN and RHRCk are processed by the first refresh state circuit. Specifically, RHRState1 changes from a low level to a high level in the process of RHRa to record and complete the refresh of the first adjacent word line.

Next, since the 2nd Pulse in the first refresh period is missing, RefPulseCounte will not generate a square wave again. Therefore, neither RHRState1 nor RHRState2 is changed, and the valid states of RHRStart and RHR will be continued to the next refresh period (that is, the time after REFCmd2 command is received and before a new command is received).

Next, RHRa and RHRb are executed once at the 1st Pulse and 2nd Pulse in the next refresh period, respectively. At this time, Refreshpulse1 is only at the high level state during the 1st Pulse, and RefPulseCounter generates a square wave for each Pulse, so RHRCkN and RHRCk change accordingly. At this time, RHRState1 will be changed from high level to low level at the falling edge of the second square wave of RefPulseCounter. On the contrary, RHRState2 will be changed from low level to high level at the falling edge of the second square wave of RefPulseCounter to indicate that the refresh of the second adjacent word line is completed.

Finally, since RHRStart remains high level, RHRState2 is changed from low level to high level, so the RHR signal is changed from high level to low level, and RHRStart will be changed from high level to high level together with the falling edge of 2nd Pulse.

In this way, in the case that an occasional error occurs, the valid state of the preset row hammer refresh signal RHR will be continued to the next refresh period, so that the row hammer refresh instruction is completed through two refresh periods, which not only saves bandwidth resources, but also improves the correctness of row hammer refresh.

It should be understood that for row hammer refresh instruction, word line activation instruction needs to be avoided between refresh operation of the first adjacent word line and refresh operation of the second adjacent word line. That is to say, if a word line activation instruction is received after refreshing the first adjacent word line and before refreshing the second adjacent word line, it needs to be recorded for subsequent processing.

Figure 10:
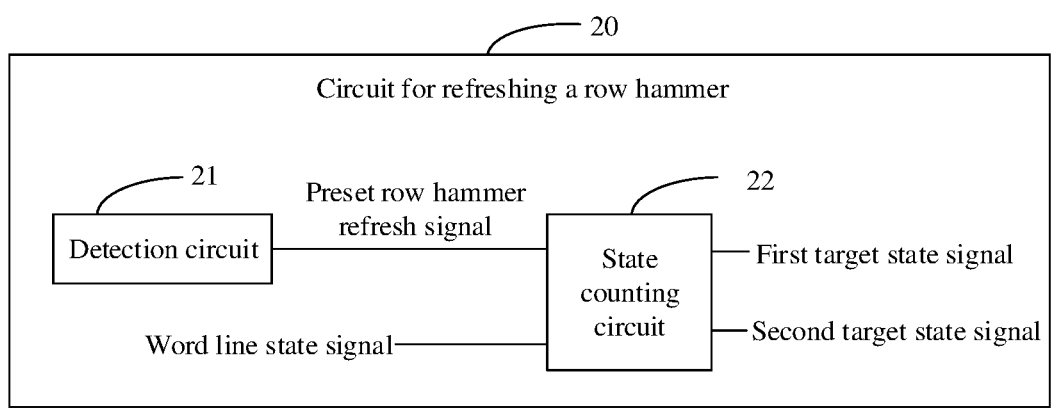
FIG. 10 is a schematic structural diagram of another circuit for refreshing row hammer provided by the embodiments of the present disclosure.

Therefore, in some embodiments, referring to FIG. 10, it shows a schematic structural diagram of another circuit for refreshing row hammer 20 provided by the embodiments of the present disclosure. As shown in FIG. 10, the circuit for refreshing row hammer 20 further includes a state counting circuit 22.

The state counting circuit 22 is configured to receive the preset row hammer refresh signal RHR and the word line state signal, and determine the first target state signal RHRAct1 and the second target state signal RHRAct2 according to the preset row hammer refresh signal RHR and the word line state signal.

It should be noted that the state counting circuit 22 is configured to output the first target state signal RHRAct1 and the second target state signal RHRAct2, so as to record the current row hammer refresh processing. Specifically, the first target state signal RHRAct1 is configured to record the refresh state of the first adjacent word line, and the second target state signal RHRAct2 is configured to record the refresh state of the second adjacent word line.

In some embodiments, the word line state signal includes a refresh state valid signal Rfsh and a word line start pulse signal RasEnpulse. The refresh state valid signal Rfsh indicates whether it is in a refresh period, and the word line start pulse signal RasEnpulse indicates starting of any word line.

That is to say, if the Memory Array at is in a refresh period at current time, the refresh state valid signal Rfsh is in the valid state, and if the Memory Array is at current time in other operation periods such as activation, precharge, standby, etc., the refresh state valid signal Rfsh is in the invalid state. In addition, the word line start pulse signal RasEnpulse generates a square wave during the starting of any word line.

Figure 11:
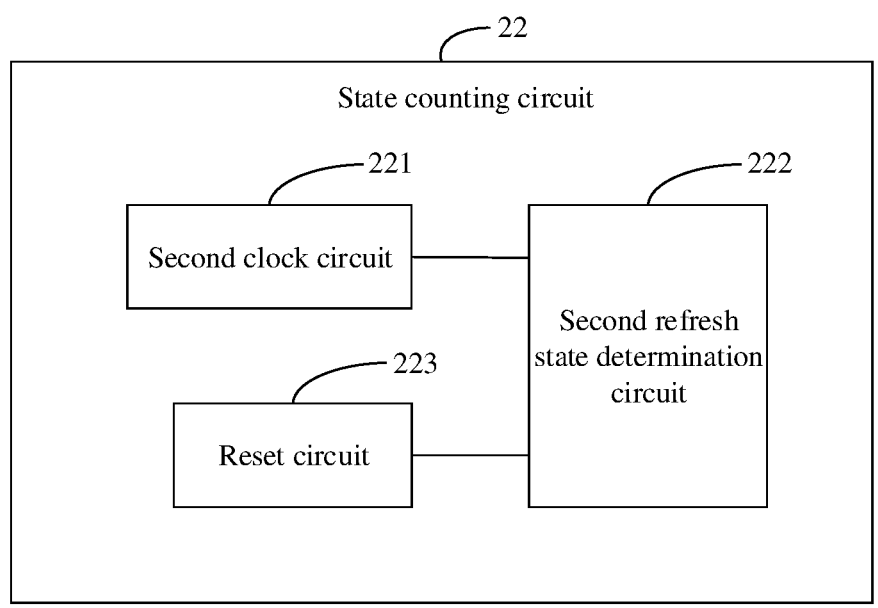
FIG. 11 is a schematic structural diagram of a state counting circuit provided by the embodiments of the present disclosure.

Correspondingly, referring to FIG. 11, it shows a schematic structural diagram of the state counting circuit 22 provided by the embodiments of the present disclosure. As shown in FIG. 11, the state counting circuit 22 includes a second clock circuit 221, a second refresh state determination circuit 222 and a reset circuit 223.

The second clock circuit 221 is configured to determine the second clock signal RHRCounter and the second inverted clock signal RHRCounterN according to the preset row hammer refresh signal RHR, the refresh state valid signal Rfsh and the word line start pulse signal RasEnpulse.

The reset circuit 223 is configured to determine a reset signal ResetN according to the refresh state valid signal Rfsh, the word line start pulse signal RasEnpulse and the first target state signal RHRAct1.

The second refresh state determination circuit 222 is configured to determine the first target state signal RHRAct1 and the second target state signal RHRAct2 according to the second clock signal RHRCounter, the second inverted clock signal RHRCounterN and the reset signal ResetN.

It should be noted that the state counting circuit 22 includes at least the following three parts: the second clock circuit 221, the second refresh state determination circuit 222 and the reset circuit 223.

(1) The second clock circuit 221 is mainly configured to output the second clock signal RHRCounter and the second inverted clock signal RHRCounterN, so as to provide necessary signal support for the subsequent second refresh state determination circuit 222.

Figure 12:
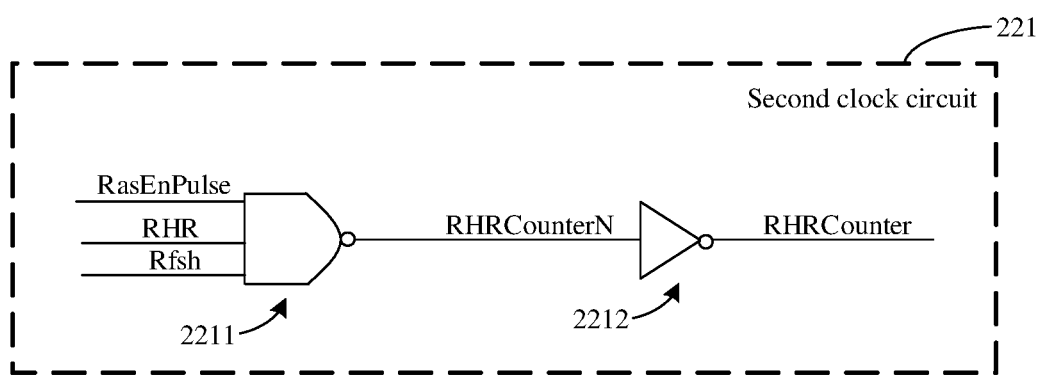
FIG. 12 is a schematic diagram of a specific circuit structure of a second clock circuit provided by the embodiments of the present disclosure.

Exemplarily, referring to FIG. 12, it shows a schematic diagram of a specific circuit structure of the second clock circuit 221 provided by the embodiments of the present disclosure. As shown in FIG. 12, the second clock circuit 221 includes a first three-input NAND gate 2211 and a fifth NOT gate 2212.

The input ends of the first three-input NAND gate 2211 are respectively connected with the preset row hammer refresh signal RHR, the refresh state valid signal Rfsh and the word line start pulse signal RasEnpulse, and the output end of the first three-input NAND gate 2211 is configured to output the second inverted clock signal RHRCounterN. The input end of the fifth NOT gate 2212 is connected with the output end of the first three-input NAND gate 2211, and the output end of the fifth NOT gate 2212 is configured to output the second clock signal RHRCounter.

(2) The second refresh state determination circuit 222 is mainly configured to output the first target state signal RHRAct1 and the second refresh state signal RHRAct2 to record the refresh state of the first adjacent word line and the refresh state of the second adjacent word line.

Figure 13:
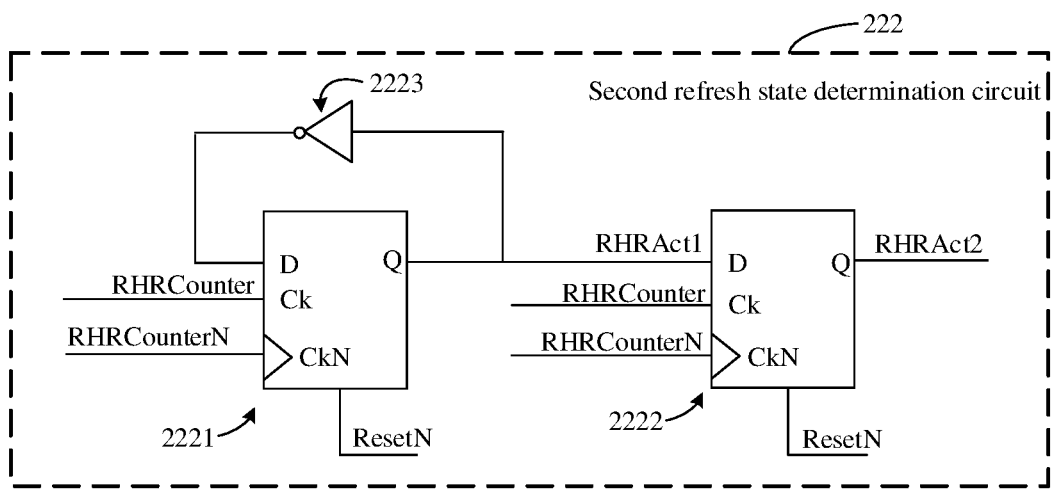
FIG. 13 is a schematic diagram of a specific circuit structure of a second refresh state determination circuit provided by the embodiments of the present disclosure.

Exemplarily, referring to FIG. 13, it shows a schematic diagram of a specific circuit structure of the second refresh state determination circuit 222 provided by the embodiments of the present disclosure. As shown in FIG. 13, the second refresh state determination circuit 222 includes a third trigger 2221, a fourth trigger 2222 and a sixth NOT gate 2223.

The input end of the third trigger 2221 is connected with the output end of the third trigger 2221 through the sixth NOT gate 2223, and the output end of the third trigger 2221 is configured to output the first target state signal RHRAct1. The clock end of the third trigger 2221 is respectively connected with the second clock signal RHRCounter and the second inverted clock signal RHRCounterN. The input end of the fourth trigger 2222 is connected with the first target state signal RHRAct1, and the clock end of the fourth trigger 2222 is respectively connected with the second clock signal RHRCounter and the second inverted clock signal RHRCounterN, and the output end of the fourth trigger 2222 is configured to output the second target state signal RHRAct2. The reset end of the third trigger 2221 and the reset end of the fourth trigger 2222 are both connected to the reset signal ResetN.

(3) The reset circuit 223 is mainly configured to output the reset signal ResetN to provide necessary signal support for the second refresh state determination circuit 222.

Figure 14:
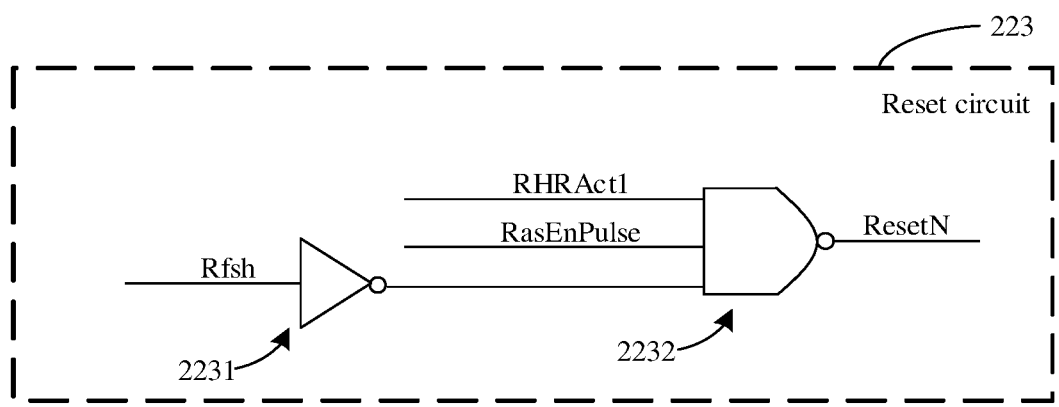
FIG. 14 is a schematic diagram of a specific circuit structure of a reset circuit provided by the embodiments of the present disclosure.

Exemplarily, referring to FIG. 14, it shows a schematic diagram of a specific circuit structure of the reset circuit 223 provided by the embodiments of the present disclosure. As shown in FIG. 14, the reset circuit 223 includes a seventh NOT gate 2231 and a second three-input NAND gate 2232.

The input end of the seventh NOT gate 2231 is connected with the refresh state valid signal Rfsh, and the input ends of the second three-input NAND gate 2232 are respectively connected with the output end of the seventh NOT gate 2231, the word line start pulse signal RasEnpulse and the first target state signal RHRAct1, and the output end of the second three-input NAND gate 2232 is configured to output the reset signal ResetN.

In particular, in the embodiments of the present disclosure, the reset signal ResetN is valid at a low level. That is, when the reset signal ResetN is at a low level, the third trigger 2221 and the fourth trigger 2222 are reset.

It should be understood that the initial states of the first target state signal RHRAct1 and the second target state signal RHRAct2 are both invalid states. For the first target state signal RHRAct1 and the second target state signal RHRAct2, the change logic is as follows.

Under normal cases, in order to complete the row hammer refresh instruction, the refreshing of the first adjacent word line and the second adjacent word line need to be completed in sequence in the first refresh period. At this time, when the first word line is started, the first target state signal RHRAct1 is changed to be valid, and the second target state signal RHRAct2 is still invalid. When the second word line is started, the first target state signal RHRAct1 is changed to be invalid, and the second target state signal RHRAct2 is changed to be valid.

In the case that an occasional error occurs, only the refreshing of the first adjacent word line is completed within the first refresh period. Specifically, when the first word line is started, the first target state signal RHRAct1 is changed to the valid state, and the second target state signal RHRAct2 is still in the invalid state. Then, there are two possibilities: (1) the word line activation instruction is not received between the first refresh period and the next refresh period, that is, the starting of word line does not exist between the first refresh period and the next refresh period. In this way, at the beginning of the next refresh period, the first target state signal RHRAct1 remains valid, and the second target state signal RHRAct2 remains invalid. (2) The word line activation instruction is received between the first refresh period and the next refresh period. The starting of word line exists between the first refresh period and the next refresh period, the reset signal ResetN is presented to be valid, and the first target state signal RHRAct1 and the second target state signal RHRAct2 are both set to be invalid.

In addition, after the row hammer refresh instruction is completed, the first target state signal RHRAct1 and the second target state signal RHRAct2 are both reset to the invalid state, and the specific reset process may be implemented by circuits with various principles, which is not described in the embodiments of the present disclosure.

In this way, through the first target state signal RHRAct1 and the second target state signal RHRAct2, the refresh states of the first adjacent word line and the second adjacent word line may be accurately recorded, and targeted refresh processing may be performed subsequently to avoid that a word line activation instruction is inserted between the refreshing of the word line and the refreshing of the second adjacent word line, resulting in an error problem.

Based on the above circuit for refreshing row hammer, the preset row hammer refresh signal RHR, the first target state signal RHRAct1 and the second target state signal RHRAct2 can be determined, and then a specific process of refreshing row hammer is determined according to these signals, including at least the following two cases.

In the first case, at the beginning of a certain refresh period, the preset row hammer refresh signal is in the valid state, the first target state signal is invalid and the second target state signal is invalid. There are two possibilities for this case: (1) the row hammer refresh instruction is received in the present refresh period. (2) The row hammer refresh instruction was received in the previous refresh period, but the row hammer refresh instruction was not completed in the previous refresh period due to the occasional error, and word line activation instruction is occurred between the previous refresh period and the present refresh period. For the above two possibilities, it is necessary to perform refreshing on the first adjacent word line and the second adjacent word line in the present refresh period.

In the second case, at the beginning of a certain refresh period, the preset row hammer refresh signal is in the valid state, the first target state signal is valid, and the second target state signal is invalid, which indicates that the row hammer refresh instruction is received in the previous refresh period of the present refresh period. However, due to an occasional error, the refreshing was only performed on the first adjacent word line in the previous refresh period, and word line activation instruction was not received between the previous refresh period and the present refresh period. At this time, the word line refresh processing may be directly performed on the second adjacent word line repeatedly, so that the row hammer refresh instruction that was not completed in the previous refresh period is completed.

That is to say, based on the circuit for refreshing row hammer provided by the embodiments of the present disclosure, a method for completing the row hammer refresh in one refresh command (equivalent to one refresh period) with automatic error correction are provided.

(1) If the RHRb in the first refresh command is missing, the signal RHR representing row hammer refresh will be continued to the next refresh command (2) When an active command occurs between two refresh commands, the RHR state counter (the first trigger and the second trigger) are reset. Specifically, if the RHRb in the first refresh command is missing, and the active command occurs between two refresh commands, at this time, RHRAct1=1, Rfsh=0, and the storage array needs to start WL Pulse when executing the active command, thereby triggering RasEn-Pulse, and then changing the state of ResetN and resetting the RHR state counter.

(3) RHRa and RHRb are completed in the second refresh command

In addition, if the RHRb in the first refresh command is missing, and the active command does not occur between the two refresh commands, then the RHRb is performed twice in the second refresh command.

In addition, FIG. 6-FIG. 8 and FIG. 11-FIG. 13 are only possible structures of corresponding circuits, and those skilled in the art may add, delete and modify corresponding circuit elements according to the actual application scenarios of different circuits.

In this way, the preset row hammer refresh signal can be provided by the detection circuit, and the first target state signal and the second target state signal can be provided by the state counting circuit, so as to implement the above method for refreshing row hammer.

The embodiments of the present disclosure provide a circuit for refreshing row hammer. The circuit includes a detection circuit. The detection circuit is configured to determine a row hammer refresh trigger signal and a refresh execution signal; and output a preset row hammer refresh signal in a valid state in response to the row hammer refresh trigger signal indicating that a row hammer refresh instruction for a target word line is received and the refresh execution signal indicating that the row hammer refresh instruction is not completed. The valid state of the preset row hammer refresh signal indicates that the row hammer refresh instruction is performed within a first refresh period, and the valid state of the preset row hammer refresh signal will be continued to a next refresh period of the first refresh period in a case that the row hammer refresh instruction is not completed within the first refresh period. In this way, the preset row hammer refresh signal can be provided through the detection circuit. Under normal cases, the valid state of the preset row hammer refresh signal lasts for one refresh period, so that the row hammer refresh instruction is completed through one refresh period. In the case that an occasional error occurs, the valid state of the preset row hammer refresh signal will be continued to the next refresh period, so that the row hammer refresh instruction is completed through two refresh periods, which can not only save bandwidth resources, but also improve the correctness of row hammer refresh.

Figure 15:
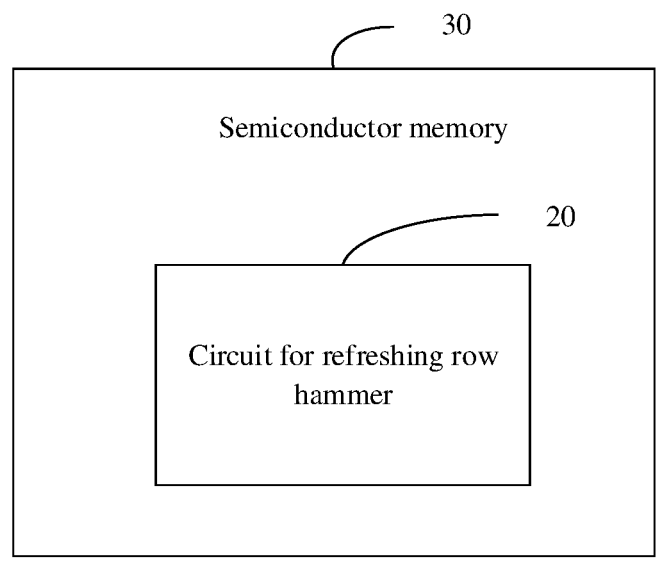
FIG. 15 is a schematic structural diagram of a semiconductor memory provided by the embodiments of the present disclosure.

In another embodiment of the present disclosure, referring to FIG. 15, it shows a schematic structural diagram of a semiconductor memory 30 provided by the embodiments of the present disclosure. As shown in FIG. 15, the semiconductor memory 30 includes at least the circuit for refreshing row hammer 20.

Since the semiconductor memory 30 includes at least the circuit for refreshing row hammer 20, it can output a preset row hammer refresh signal. Under normal cases, the valid state of the preset row hammer refresh signal lasts for one refresh period, so that the row hammer refresh instruction is completed through one refresh period. In the case that an occasional error occurs, the valid state of the preset row hammer refresh signal will be continued to the next refresh period, so that the row hammer refresh instruction is completed through two refresh periods, which can not only save bandwidth resources, but also improve the correctness of row hammer refresh.

The above are only preferred embodiments of the present disclosure, and are not intended to limit the protection scope of the present disclosure.

It should be noted that, in the present disclosure, the terms "comprising", "containing" or any other variation thereof are intended to encompass non-exclusive inclusion, such that a process, method, object or device comprising a series of elements includes not only those elements, but also other elements not expressly listed or inherent to such a process, method, object or device. Without further limitation, an element qualified by the phrase "comprising a . . . " does not preclude the presence of additional identical elements in a process, method, object or device that includes the element.

The above serial numbers of the embodiments of the present disclosure are only for description, and do not represent the advantages or disadvantages of the embodiments.

The methods disclosed in the several method embodiments provided in the present disclosure may be combined arbitrarily without conflict to obtain new method embodiments.

The features disclosed in the several product embodiments provided in the present disclosure can be combined arbitrarily without conflict to obtain a new product embodiment.

The features disclosed in several method or device embodiments provided in the present disclosure may be combined arbitrarily without conflict to obtain new method embodiments or device embodiments.

The above are only specific embodiments of the present disclosure, but the protection scope of the present disclosure is not limited thereto. Any person skilled in the art who is familiar with the technical scope of the present disclosure can easily think of changes or substitutions, which should cover within the scope of protection of the present disclosure. Therefore, the protection scope of the present disclosure should be subject to the protection scope of the claims.

INDUSTRIAL APPLICABILITY

The embodiments of the present disclosure provide a method for refreshing row hammer, a circuit for refreshing row hammer and a semiconductor memory. The method includes the following operations. A row hammer refresh instruction for a target word line is determined. According to the row hammer refresh instruction, a preset row hammer refresh signal is set to a valid state. The valid state of the preset row hammer refresh signal indicates that the row hammer refresh instruction is performed in a first refresh period. In response to detecting that the row hammer refresh instruction is not completed within the first refresh period, the valid state of the preset row hammer refresh signal will be continued to a next refresh period of the first refresh period. In this way, under normal cases, the valid state of the preset row hammer refresh signal lasts for one refresh period, so that the row hammer refresh instruction is completed through one refresh period. In the case that an occasional error occurs, the valid state of the preset row hammer refresh signal will be continued to the next refresh period, so that the row hammer refresh instruction is completed through two refresh periods, which can not only save bandwidth resources, but also improve the correctness of row hammer refresh.

What is claimed is:

1. A method for refreshing a row hammer, comprising:
    determining a row hammer refresh instruction for a target word line;
    setting, according to the row hammer refresh instruction, a preset row hammer refresh signal to a valid state, wherein the valid state of the preset row hammer refresh signal indicates that the row hammer refresh instruction is performed in a first refresh period; and
    in response to detecting that the row hammer refresh instruction is not completed within the first refresh period, continuing the valid state of the preset row hammer refresh signal to a next refresh period of the first refresh period.

2. The method for refreshing the row hammer of claim 1, further comprising:
    in response to detecting that the row hammer refresh instruction is completed, setting the preset row hammer refresh signal to an invalid state.

3. The method for refreshing the row hammer of claim 2, wherein the row hammer refresh instruction instructs to refresh a first adjacent word line of the target word line and a second adjacent word line of the target word line,
    wherein the method further comprises:
    determining whether the first adjacent word line and the second adjacent word line are both refreshed in the first refresh period; and
    in response to the first adjacent word line being refreshed and the second adjacent word line being not refreshed, determining that the row hammer refresh instruction is not completed within the first refresh period; or
    in response to the first adjacent word line and the second adjacent word line being both refreshed, determining that the row hammer refresh instruction is completed within the first refresh period.

4. The method for refreshing the row hammer of claim 3, further comprising:
    determining a first target state signal and a second target state signal, wherein the first target state signal is configured to record a refresh state of the first adjacent word line, and the second target state signal is configured to record a refresh state of second adjacent word line;
    when refreshing is conducted for the first adjacent word line, setting the first target state signal to the valid state, and setting the second target state signal to the invalid state; and
    when refreshing is conducted for the second adjacent word line, setting the first target state signal to the invalid state, and the second target state signal is set to the valid state.

5. The method for refreshing the row hammer of claim 4, in a case of detecting that the row hammer refresh instruction is not completed within the first refresh period, wherein the method further comprises:
    determining whether a word line activation instruction is received; and
    in response to a determination result being yes, setting both the first target state signal and the second target state signal to the invalid state.

6. The method for refreshing the row hammer of claim 5, further comprising:
    in a case that the preset row hammer refresh signal is in the valid state, determining the first target state signal and the second target state signal; and
    performing word line refresh processing on adjacent word lines of the target word line according to the first target state signal and the second target state signal.

7. The method for refreshing the row hammer of claim 6, wherein performing the word line refresh processing on the adjacent word lines of the target word line according to the first target state signal and the second target state signal comprises:
    in a case that the first target state signal and the second target state signal are both in the invalid state, performing the word line refresh processing on the first adjacent word line and the second adjacent word line respectively; and in a case that the first target state signal is in the valid state and the second target state signal is in the invalid state, performing the word line refresh process twice on the second adjacent word line.

8. A circuit for refreshing a row hammer, comprising:
a detection circuit, configured to:
determine a row hammer refresh trigger signal and a refresh execution signal; and
output a preset row hammer refresh signal in a valid state in response to the row hammer refresh trigger signal indicating that a row hammer refresh instruction for a target word line is received and the refresh execution signal indicating that the row hammer refresh instruction is not completed,
wherein the valid state of the preset row hammer refresh signal indicates that the row hammer refresh instruction is performed within a first refresh period, and the valid state of the preset row hammer refresh signal will be continued to a next refresh period of the first refresh period in a case that the row hammer refresh instruction is not completed within the first refresh period.

9. The circuit for refreshing a row hammer of claim 8, wherein the refresh execution signal comprises an initial refresh execution signal and a refresh pulse signal, correspondingly, the detection circuit comprises a first clock circuit, a first refresh state determination circuit and a control signal output circuit,
wherein the first refresh state determination circuit is configured to determine a first refresh state signal and a second refresh state signal according to the row hammer refresh trigger signal, a first clock signal and a first inverted clock signal,
wherein the first clock circuit is configured to determine the first clock signal and the first inverted clock signal according to the first refresh state signal, the initial refresh execution signal and the refresh pulse signal,
wherein the control signal output circuit is configured to determine the preset row hammer refresh signal according to the row hammer refresh trigger signal and the second refresh state signal,
wherein the row hammer refresh instruction instructs to perform word line refresh processing on a first adjacent word line of the target word line and a second adjacent word line of the target word line, and the initial refresh execution signal is configured to indicate a word line refresh processing that occurs for a first time in each refresh period, and the refresh pulse signal is configured to indicate a word line refresh processing that occurs each time in the each refresh period.

10. The circuit for refreshing a row hammer of claim 9, wherein the first clock circuit comprises a first two-input NAND gate, a second two-input NAND gate and a first NOT gate,
wherein input ends of the first two-input NAND gate are respectively connected with the first refresh state signal and the initial refresh execution signal;
wherein input ends of the second two-input NAND gate are respectively connected with an output end of the first two-input NAND gate and the refresh pulse signal, and an output end of the second two-input NAND gate is configured to output the first inverted clock signal;

wherein an input end of the first NOT gate is connected with the first inverted clock signal, and an output end of the first NOT gate is configured to output the first clock signal.

11. The circuit for refreshing a row hammer of claim 9, wherein the first refresh state determination circuit comprises a first two-input NOR gate, a third two-input NAND gate, a second NOT gate, a first trigger and a second trigger,
wherein input ends of the first two-input NOR gate are respectively connected with the first refresh state signal and the second refresh state signal, and input ends of the third two-input NAND gate are respectively connected with an output end of the first two-input NOR gate and the row hammer refresh trigger signal, and an input end of the second NOT gate is connected with an output end of the third two-input NAND gate,
wherein an input end of the first trigger is connected with an output end of the second NOT gate, and a clock end of the first trigger is respectively connected with the first clock signal and the first inverted clock signal, and an output end of the first trigger is configured to output the first refresh state signal,
wherein an input end of the second trigger is connected with the first refresh state signal, a clock end of the second trigger is respectively connected with the first clock signal and the first inverted clock signal, and the output end of the second trigger is configured to output the second refresh state signal.

12. The circuit for refreshing a row hammer of claim 9, wherein the control signal output circuit comprises a third NOT gate, a fourth two-input NAND gate and a fourth NOT gate,
wherein an input end of the third NOT gate is connected with the second refresh state signal, and input ends of the fourth two-input NAND gate are respectively connected with an output end of the third NOT gate and the row hammer refresh trigger signal,
wherein an input end of the fourth NOT gate is connected with an output end of the fourth two-input NAND gate, and an output end of the fourth NOT gate is configured to output the preset row hammer refresh signal.

13. The circuit for refreshing a row hammer of claim 9, wherein the circuit for refreshing a row hammer further comprises a state counting circuit,
wherein the state counting circuit is configured to receive the preset row hammer refresh signal and the word line state signal, and determine a first target state signal and a second target state signal according to the preset row hammer refresh signal and the word line state signal,
wherein the first target state signal is configured to record a refresh state of the first adjacent word line, and the second target state signal is configured to record the refresh state of the second adjacent word line.

14. The circuit for refreshing a row hammer of claim 13, wherein the word line state signal comprises a refresh state valid signal and a word line start pulse signal, and the state counting circuit comprises a second clock circuit, a second refresh state determination circuit and a reset circuit,
wherein the second clock circuit is configured to determine a second clock signal and a second inverted clock signal according to the preset row hammer refresh signal, the refresh state valid signal and the word line start pulse signal,
wherein the reset circuit is configured to determine a reset signal according to the refresh state valid signal, the word line start pulse signal and the first target state signal, wherein the second refresh state determination circuit is configured to determine the first target state signal and the second target state signal according to the second clock signal, the second inverted clock signal and the reset signal, wherein the refresh state valid signal indicates whether a memory array is in a refresh period at current time, and the word line start pulse signal indicates starting of any word line.

15. The circuit for refreshing a row hammer of claim 14, wherein the second clock circuit comprises a first three-input NAND gate and a fifth NOT gate, wherein input ends of the first three-input NAND gate are respectively connected with the preset row hammer refresh signal, the refresh state valid signal and the word line start pulse signal, and an output end of the first three-input NAND gate is configured to output the second inverted clock signal, wherein an input end of the fifth NOT gate is connected with an output end of the first three-input NAND gate, and an output end of the fifth NOT gate is configured to output the second clock signal.

16. The circuit for refreshing a row hammer of claim 14, wherein the second refresh state determination circuit comprises a third trigger, a fourth trigger and a sixth NOT gate, wherein an input end of the third trigger is connected with an output end of the third trigger through the sixth NOT gate, and the output end of the third trigger is configured to output the first target state signal, and a clock end of the third trigger is respectively connected with the second clock signal and the second inverted clock signal, wherein an input end of the fourth trigger is connected with the first target state signal, a clock end of the fourth trigger is respectively connected with the second clock signal and the second inverted clock signal, and an output end of the fourth trigger is configured to output the second target state signal, wherein a reset end of the third trigger and a reset end of the fourth trigger are both connected with the reset signal.

17. The circuit for refreshing a row hammer of claim 14, wherein the reset circuit comprises a seventh NOT gate and a second three-input NAND gate, wherein an input end of the seventh NOT gate is connected with the refresh state valid signal, and input ends of the second three-input NAND gate are respectively connected with an output end of the seventh NOT gate, the word line start pulse signal and the first target state signal, and an output end of the second three-input NAND gate is configured to output the reset signal.

18. A semiconductor memory comprising a circuit for refreshing row hammer, wherein the circuit comprises:

a detection circuit, configured to:
determine a row hammer refresh trigger signal and a refresh execution signal; and output a preset row hammer refresh signal in a valid state in response to the row hammer refresh trigger signal indicating that a row hammer refresh instruction for a target word line is received and the refresh execution signal indicating that the row hammer refresh instruction is not completed, wherein the valid state of the preset row hammer refresh signal indicates that the row hammer refresh instruction is performed within a first refresh period, and the valid state of the preset row hammer refresh signal will be continued to a next refresh period of the first refresh period in a case that the row hammer refresh instruction is not completed within the first refresh period.

19. The semiconductor memory of claim 18, wherein the refresh execution signal comprises an initial refresh execution signal and a refresh pulse signal, correspondingly, the detection circuit comprises a first clock circuit, a first refresh state determination circuit and a control signal output circuit, wherein the first refresh state determination circuit is configured to determine a first refresh state signal and a second refresh state signal according to the row hammer refresh trigger signal, a first clock signal and a first inverted clock signal, wherein the first clock circuit is configured to determine the first clock signal and the first inverted clock signal according to the first refresh state signal, the initial refresh execution signal and the refresh pulse signal, wherein the control signal output circuit is configured to determine the preset row hammer refresh signal according to the row hammer refresh trigger signal and the second refresh state signal, wherein the row hammer refresh instruction instructs to perform word line refresh processing on a first adjacent word line of the target word line and a second adjacent word line of the target word line, and the initial refresh execution signal is configured to indicate a word line refresh processing that occurs for a first time in each refresh period, and the refresh pulse signal is configured to indicate a word line refresh processing that occurs each time in the each refresh period.

20. The semiconductor memory of claim 19, wherein the first clock circuit comprises a first two-input NAND gate, a second two-input NAND gate and a first NOT gate, wherein input ends of the first two-input NAND gate are respectively connected with the first refresh state signal and the initial refresh execution signal;

wherein input ends of the second two-input NAND gate are respectively connected with an output end of the first two-input NAND gate and the refresh pulse signal, and an output end of the second two-input NAND gate is configured to output the first inverted clock signal;

wherein an input end of the first NOT gate is connected with the first inverted clock signal, and an output end of the first NOT gate is configured to output the first clock signal.

* * * * *